US012675679B2

(12) United States Patent
Di Febbo et al.

(10) Patent No.: US 12,675,679 B2
(45) Date of Patent: Jul. 7, 2026

(54) CROSSBAR CIRCUIT FOR UNALIGNED MEMORY ACCESS IN NEURAL NETWORK PROCESSOR

(71) Applicant: Apple Inc., Cupertino, CA (US)

(72) Inventors: Paolo Di Febbo, Redwood City, CA (US); Anthony Ghannoum, Santa Clara, CA (US)

(73) Assignee: APPLE INC., Cupertino, CA (US)

( * ) Notice: Subject to any disclaimer, the term of this patent is extended or adjusted under 35 U.S.C. 154(b) by 996 days.

(21) Appl. No.: 17/518,059

(22) Filed: Nov. 3, 2021

(65) Prior Publication Data

US 2023/0135306 A1     May 4, 2023

(51) Int. Cl.
| | |
|---|---|
| *G06N 3/063* | (2023.01) |
| *G06F 5/06* | (2006.01) |
| *G11C 7/10* | (2006.01) |
| *G11C 11/40* | (2006.01) |
| *G11C 11/54* | (2006.01) |

(52) U.S. Cl.
CPC .............. *G06N 3/063* (2013.01); *G06F 5/06* (2013.01); *G11C 7/1012* (2013.01); *G11C 11/40* (2013.01); *G11C 11/54* (2013.01)

(58) Field of Classification Search
CPC ...... G06N 3/063; G06N 3/0464; G06N 3/048; G06N 3/09; G06N 3/084; G06F 5/06; G11C 7/1012
See application file for complete search history.

(56) References Cited

U.S. PATENT DOCUMENTS

| | | | |
|---|---|---|---|
| 2015/0109024 A1* | 4/2015 | Abdelfattah ... | H03K 19/017581 |
| | | | 326/41 |
| 2015/0143086 A1* | 5/2015 | Khan .................. | G06F 15/8076 |
| | | | 712/226 |
| 2016/0247565 A1* | 8/2016 | Perner ................ | G11C 13/0002 |
| 2019/0294413 A1* | 9/2019 | Vantrease ............ | G06F 7/5095 |
| 2020/0134436 A1* | 4/2020 | Kataeva ................ | G06T 9/002 |
| 2020/0233820 A1 | 7/2020 | McBride et al. | |
| 2020/0364823 A1 | 11/2020 | Ould-Ahmed-Vall et al. | |
| 2021/0233273 A1 | 7/2021 | Spurr et al. | |
| 2022/0012563 A1* | 1/2022 | Castro Gonzalez ..... | G06N 3/04 |

* cited by examiner

*Primary Examiner* — Tan H Tran

(74) *Attorney, Agent, or Firm* — Sterne, Kessler, Goldstein & Fox P.L.L.C.

(57) ABSTRACT

Embodiments of the present disclosure relate to an unaligned memory access in a neural processor circuit. The neural processor circuit includes a crossbar circuit and a neural engine circuit coupled to the crossbar circuit. During each operating cycle of the neural processor circuit, the crossbar circuit receives a portion of input data, and re-aligns or bypasses the portion of input data. The neural engine circuit receives at least a portion of the re-aligned or bypassed portion of the input data, and performs a convolution operation on the received portion of re-aligned or bypassed portion of input data to generate output data.

20 Claims, 12 Drawing Sheets

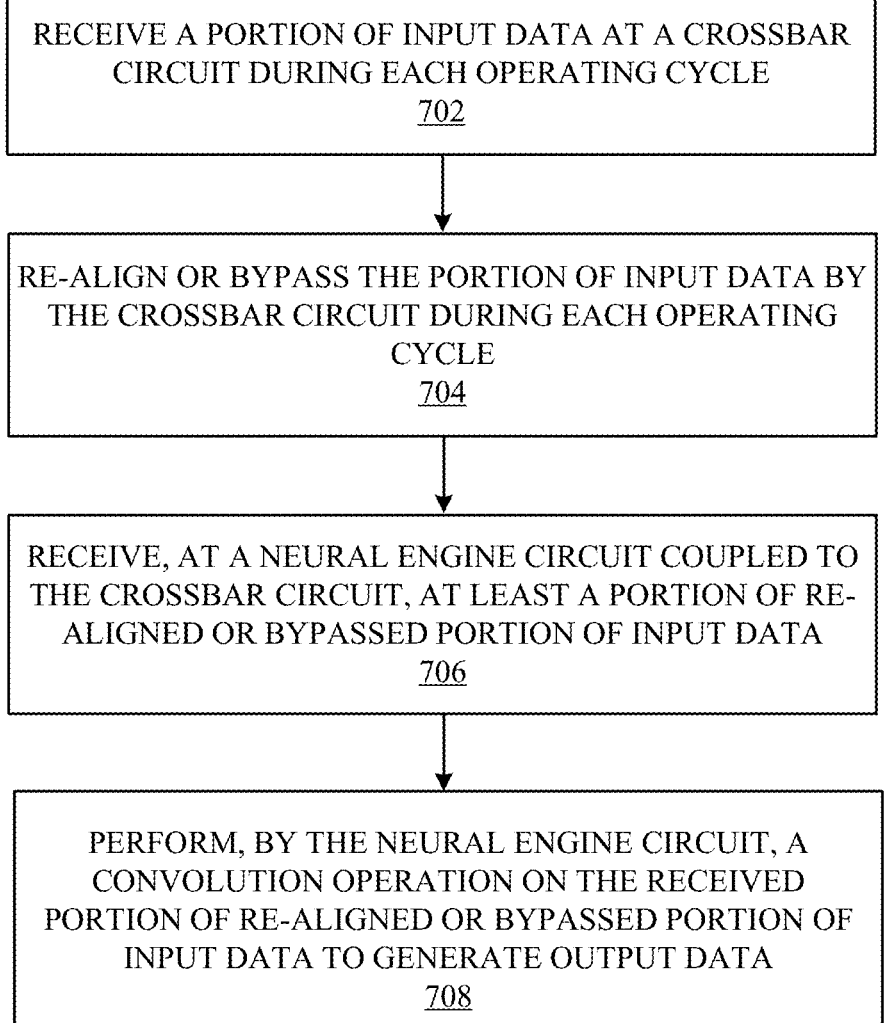

RECEIVE A PORTION OF INPUT DATA AT A CROSSBAR CIRCUIT DURING EACH OPERATING CYCLE
702

RE-ALIGN OR BYPASS THE PORTION OF INPUT DATA BY THE CROSSBAR CIRCUIT DURING EACH OPERATING CYCLE
704

RECEIVE, AT A NEURAL ENGINE CIRCUIT COUPLED TO THE CROSSBAR CIRCUIT, AT LEAST A PORTION OF RE-ALIGNED OR BYPASSED PORTION OF INPUT DATA
706

PERFORM, BY THE NEURAL ENGINE CIRCUIT, A CONVOLUTION OPERATION ON THE RECEIVED PORTION OF RE-ALIGNED OR BYPASSED PORTION OF INPUT DATA TO GENERATE OUTPUT DATA
708

*FIG. 7*

CROSSBAR CIRCUIT FOR UNALIGNED MEMORY ACCESS IN NEURAL NETWORK PROCESSOR

BACKGROUND

1. Field of the Disclosure

The present disclosure relates to a circuit for performing operations related to neural networks, and more specifically to a crossbar circuit for an unaligned memory access in a neural network processor.

2. Description of the Related Arts

An artificial neural network (ANN) is a computing system or model that uses a collection of connected nodes to process input data. The ANN is typically organized into layers where different layers perform different types of transformation on their input. Extensions or variants of ANN such as convolution neural network (CNN), recurrent neural networks (RNN) and deep belief networks (DBN) have come to receive much attention. These computing systems or models often involve extensive computing operations including multiplication and accumulation. For example, CNN is a class of machine learning technique that primarily uses convolution between input data and kernel data, which can be decomposed into multiplication and accumulation operations.

Depending on the types of input data and operations to be performed, these machine learning systems or models can be configured differently. Such varying configuration would include, for example, pre-processing operations, the number of channels in input data, kernel data to be used, non-linear function to be applied to convolution result, and applying of various post-processing operations. Using a central processing unit (CPU) and its main memory to instantiate and execute machine learning systems or models of various configuration is relatively easy because such systems or models can be instantiated with mere updates to code. However, relying solely on the CPU for various operations of these machine learning systems or models would consume significant bandwidth of the CPU as well as increase the overall power consumption.

SUMMARY

Embodiments relate to an unaligned memory access in a neural processor circuit. The neural processor circuit includes a crossbar circuit and a neural engine circuit coupled to the crossbar circuit. During each operating cycle of the neural processor circuit, the crossbar circuit receives a portion of input data, and re-aligns or bypasses the portion of input data. The neural engine circuit receives at least a portion of the re-aligned or bypassed portion of the input data, and performs a convolution operation on the received portion of re-aligned or bypassed portion of input data to generate output data.

BRIEF DESCRIPTION OF THE DRAWINGS

Figure (FIG.) 1 is a high-level diagram of an electronic device, according to one embodiment.

FIG. 7 is a flowchart illustrating a method of re-aligning or bypassing a portion of input data in the neural processor circuit using the crossbar circuit, according to one embodiment.

Figure 1:
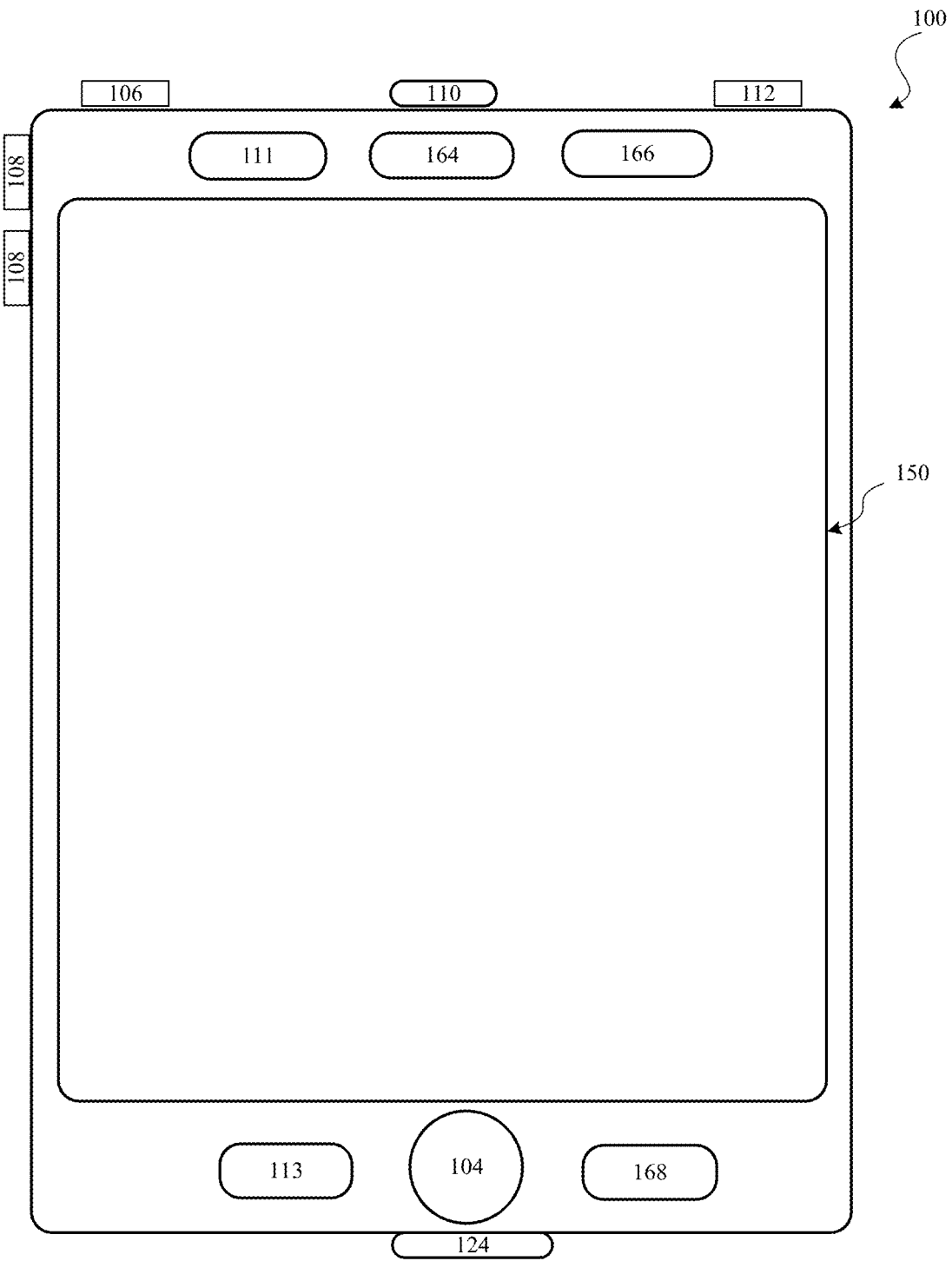

The figures depict, and the detail description describes, various non-limiting embodiments for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments of the present disclosure relate to an unaligned memory access in a neural processor circuit. The neural processor circuit includes a crossbar circuit and a neural engine circuit coupled to the crossbar circuit. During each operating cycle of the neural processor circuit, the crossbar circuit receives a portion of input data, and re-aligns or bypasses the portion of input data. The neural engine circuit receives at least a portion of the re-aligned or bypassed portion of the input data, and performs a convolution operation on the received portion of re-aligned or bypassed portion of input data to generate output data. The crossbar circuit presented herein directly connects a buffer memory (e.g., L2 cache) of the neural processor circuit with an array of neural engine circuits that perform, e.g., convolution operations on image data (e.g., pixel data). The crossbar circuit avoids the need for intermediate cache or buffer components that would cost additional area and incur power consumption. The crossbar circuit may be utilized within a compact neural processor circuit running at a low power, and does not require high clock frequencies and high processing parallelism to achieve a desired throughput. During each operating cycle, the crossbar circuit may re-align pixel data fetched from the buffer memory such that output data (e.g., re-aligned pixel data) generated by the crossbar circuit can be directly accessed by the array of neural engine circuits and used for a convolution operation during that operating cycle.

Exemplary Electronic Device

Embodiments of electronic devices, user interfaces for such devices, and associated processes for using such devices are described. In some embodiments, the device is a portable communications device, such as a mobile telephone, that also contains other functions, such as personal digital assistant (PDA) and/or music player functions. Exemplary embodiments of portable multifunction devices include, without limitation, the iPhone®, iPod Touch®, Apple Watch®, and iPad® devices from Apple Inc. of Cupertino, California Other portable electronic devices, such as wearables, laptops or tablet computers, are optionally used. In some embodiments, the device is not a portable communication device, but is a desktop computer or other computing device that is not designed for portable use. In some embodiments, the disclosed electronic device may include a touch-sensitive surface (e.g., a touch screen display and/or a touchpad). An example electronic device described below in conjunction with Figure (FIG.) 1 (e.g., device 100) may include a touch-sensitive surface for receiving user input. The electronic device may also include one or more other physical user-interface devices, such as a physical keyboard, a mouse and/or a joystick.

FIG. 1 is a high-level diagram of an electronic device 100, according to one embodiment. Device 100 may include one or more physical buttons, such as a "home" or menu button 104. Menu button 104 is, for example, used to navigate to any application in a set of applications that are executed on device 100. In some embodiments, menu button 104 includes a fingerprint sensor that identifies a fingerprint on menu button 104. The fingerprint sensor may be used to determine whether a finger on menu button 104 has a fingerprint that matches a fingerprint stored for unlocking device 100. Alternatively, in some embodiments, menu button 104 is implemented as a soft key in a graphical user interface (GUI) displayed on a touch screen.

In some embodiments, device 100 includes touch screen 150, menu button 104, push button 106 for powering the device on/off and locking the device, volume adjustment buttons 108, Subscriber Identity Module (SIM) card slot 110, headset jack 112, and docking/charging external port 124. Push button 106 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 100 also accepts verbal input for activation or deactivation of some functions through microphone 113. Device 100 includes various components including, but not limited to, a memory (which may include one or more computer readable storage mediums), a memory controller, one or more central processing units (CPUs), a peripherals interface, an RF circuitry, an audio circuitry, speaker 111, microphone 113, input/output (I/O) subsystem, and other input or control devices. Device 100 may include one or more image sensors 164, one or more proximity sensors 166, and one or more accelerometers 168. Device 100 may include more than one type of image sensors 164. Each type may include more than one image sensor 164. For example, one type of image sensors 164 may be cameras and another type of image sensors 164 may be infrared sensors for facial recognition that is performed by one or more machine learning models stored in device 100. Device 100 may include components not shown in FIG. 1 such as an ambient light sensor, a dot projector and a flood illuminator that is to support facial recognition.

Device 100 is only one example of an electronic device, and device 100 may have more or fewer components than listed above, some of which may be combined into a component or have a different configuration or arrangement. The various components of device 100 listed above are embodied in hardware, software, firmware or a combination thereof, including one or more signal processing and/or application-specific integrated circuits (ASICs).

Figure 2:
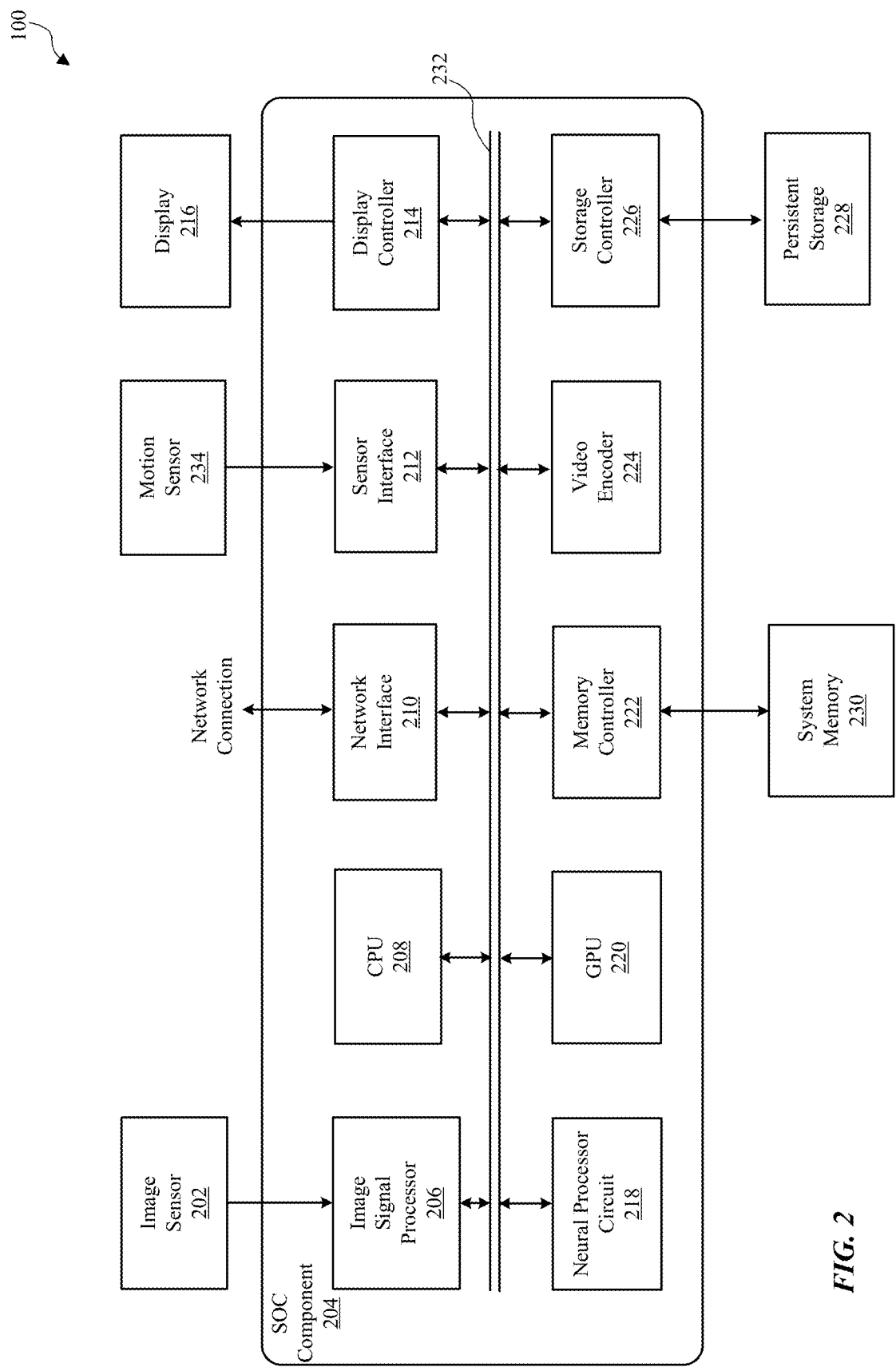
FIG. 2 is a block diagram illustrating components in the electronic device, according to one embodiment.

FIG. 2 is a block diagram illustrating components in device 100, according to one embodiment. Device 100 may perform various operations including implementing one or more machine learning models. For this and other purposes, device 100 may include, among other components, image sensors 202, a system-on-a chip (SOC) component 204, a system memory 230, a persistent storage (e.g., flash memory) 228, a motion sensor 234, and a display 216. The components as illustrated in FIG. 2 are merely illustrative. For example, device 100 may include other components (such as speaker or microphone) that are not illustrated in FIG. 2. Further, some components (such as motion sensor 234) may be omitted from device 100.

An image sensor 202 is a component for capturing image data and may be embodied, for example, as a complementary metal-oxide-semiconductor (CMOS) active-pixel sensor) a camera, video camera, or other devices. Image sensor 202 generates raw image data that is sent to SOC component 204 for further processing. In some embodiments, the image data processed by SOC component 204 is displayed on display 216, stored in system memory 230, persistent storage 228 or sent to a remote computing device via network connection. The raw image data generated by image sensor 202 may be in a Bayer color kernel array (CFA) pattern.

Motion sensor 234 is a component or a set of components for sensing motion of device 100. Motion sensor 234 may generate sensor signals indicative of orientation and/or acceleration of device 100. The sensor signals are sent to SOC component 204 for various operations such as turning on device 100 or rotating images displayed on display 216.

Display 216 is a component for displaying images as generated by SOC component 204. Display 216 may include, for example, liquid crystal display (LCD) device or an organic light-emitting diode (OLED) device. Based on data received from SOC component 204, display 116 may display various images, such as menus, selected operating parameters, images captured by image sensor 202 and processed by SOC component 204, and/or other information received from a user interface of device 100 (not shown).

System memory 230 is a component for storing instructions for execution by SOC component 204 and for storing data processed by SOC component 204. System memory 230 may be embodied as any type of memory including, for example, dynamic random access memory (DRAM), synchronous DRAM (SDRAM), double data rate (DDR, DDR2, DDR3, etc.) RAMBUS DRAM (RDRAM), static RAM (SRAM) or a combination thereof.

Persistent storage 228 is a component for storing data in a non-volatile manner. Persistent storage 228 retains data even when power is not available. Persistent storage 228 may be embodied as read-only memory (ROM), flash memory or other non-volatile random access memory devices. Persistent storage 228 stores an operating system of device 100 and various software applications. Persistent storage 228 may also store one or more machine learning models, such as regression models, random forest models, support vector machines (SVMs) such as kernel SVMs, and artificial neural networks (ANNs) such as convolutional network networks (CNNs), recurrent network networks (RNNs), autoencoders, and long short term memory (LSTM). A machine learning model may be an independent model that works with the neural processor circuit 218 and various software applications or sensors of device 100. A machine learning model may also be part of a software application. The machine learning models may perform various tasks such as facial recognition, image classification, object, concept, and information classification, speech recognition, machine translation, voice recognition, voice command recognition, text recognition, text and context analysis, other natural language processing, predictions, and recommendations.

Various machine learning models stored in device 100 may be fully trained, untrained, or partially trained to allow device 100 to reinforce or continue to train the machine learning models as device 100 is used. Operations of the machine learning models include various computation used in training the models and determining results in runtime using the models. For example, in one case, device 100 captures facial images of the user and uses the images to continue to improve a machine learning model that is used to lock or unlock the device 100.

SOC component 204 is embodied as one or more integrated circuit (IC) chip and performs various data processing processes. SOC component 204 may include, among other subcomponents, image signal processor (ISP) 206, a central processor unit (CPU) 208, a network interface 210, sensor interface 212, display controller 214, neural processor circuit 218, graphics processor (GPU) 220, memory controller 222, video encoder 224, storage controller 226, and bus 232 connecting these subcomponents. SOC component 204 may include more or fewer subcomponents than those shown in FIG. 2.

ISP 206 is a circuit that performs various stages of an image processing pipeline. In some embodiments, ISP 206 may receive raw image data from image sensor 202, and process the raw image data into a form that is usable by other subcomponents of SOC component 204 or components of device 100. ISP 206 may perform various image-manipulation operations such as image translation operations, horizontal and vertical scaling, color space conversion and/or image stabilization transformations.

CPU 208 may be embodied using any suitable instruction set architecture, and may be configured to execute instructions defined in that instruction set architecture. CPU 208 may be general-purpose or embedded processors using any of a variety of instruction set architectures (ISAs), such as the x86, PowerPC, SPARC, RISC, ARM or MIPS ISAs, or any other suitable ISA. Although a single CPU is illustrated in FIG. 2, SOC component 204 may include multiple CPUs. In multiprocessor systems, each of the CPUs may commonly, but not necessarily, implement the same ISA.

Graphics processing unit (GPU) 220 is graphics processing circuitry for performing graphical data. For example, GPU 220 may render objects to be displayed into a frame buffer (e.g., one that includes pixel data for an entire frame). GPU 220 may include one or more graphics processors that may execute graphics software to perform a part or all of the graphics operation, or hardware acceleration of certain graphics operations.

Neural processor circuit 218 is a circuit that performs various machine learning operations based on computation including multiplication, addition, and accumulation. Such computation may be arranged to perform, for example, various types of tensor multiplications such as tensor product and convolution of input data and kernel data. Neural processor circuit 218 is a configurable circuit that performs these operations in a fast and power-efficient manner while relieving CPU 208 of resource-intensive operations associated with neural network operations. Neural processor circuit 218 may receive the input data from sensor interface 212, the image signal processor 206, persistent storage 228, system memory 230 or other sources such as network interface 210 or GPU 220. The output of neural processor circuit 218 may be provided to various components of device 100 such as image signal processor 206, system memory 230 or CPU 208 for various operations. The structure and operation of neural processor circuit 218 are described below in detail with reference to FIG. 3.

Network interface 210 is a subcomponent that enables data to be exchanged between devices 100 and other devices via one or more networks (e.g., carrier or agent devices). For example, video or other image data may be received from other devices via network interface 210 and be stored in system memory 230 for subsequent processing (e.g., via a back-end interface to image signal processor 206) and display. The networks may include, but are not limited to, Local Area Networks (LANs) (e.g., an Ethernet or corporate network) and Wide Area Networks (WANs). The image data received via network interface 210 may undergo image processing processes by ISP 206.

Sensor interface 212 is circuitry for interfacing with motion sensor 234. Sensor interface 212 receives sensor information from motion sensor 234 and processes the sensor information to determine the orientation or movement of device 100.

Display controller 214 is circuitry for sending image data to be displayed on display 216. Display controller 214 receives the image data from ISP 206, CPU 208, graphic processor or system memory 230 and processes the image data into a format suitable for display on display 216.

Memory controller 222 is circuitry for communicating with system memory 230. Memory controller 222 may read data from system memory 230 for processing by ISP 206, CPU 208, GPU 220 or other subcomponents of SOC component 204. Memory controller 222 may also write data to system memory 230 received from various subcomponents of SOC component 204.

Video encoder 224 is hardware, software, firmware or a combination thereof for encoding video data into a format suitable for storing in persistent storage 228 or for passing the data to network interface 210 for transmission over a network to another device.

In some embodiments, one or more subcomponents of SOC component 204 or some functionality of these subcomponents may be performed by software components executed on neural processor circuit 218, ISP 206, CPU 208 or GPU 220. Such software components may be stored in system memory 230, persistent storage 228 or another device communicating with device 100 via network interface 210.

Example Neural Processor Circuit

Neural processor circuit 218 is a programmable circuit that performs machine learning operations on the input data of neural processor circuit 218. Machine learning operations may include different computations for training of a machine learning model and for performing inference or prediction based on the trained machine learning model.

Taking an example of a CNN as the machine learning model, training of the CNN may include forward propagation and backpropagation. A neural network may include an input layer, an output layer, and one or more intermediate layers that may be referred to as hidden layers. Each layer may include one or more nodes, which may be fully or partially connected to other nodes in adjacent layers. In forward propagation, the neural network performs computation in the forward direction based on outputs of a preceding layer. The operation of a node may be defined by one or more functions. The functions that define the operation of a node may include various computation operation such as convolution of data with one or more kernels, pooling of layers, tensor multiplication, etc. The functions may also include an activation function that adjusts the weight of the output of the node. Nodes in different layers may be associated with different functions. For example, a CNN may include one or more convolutional layers that are mixed with pooling layers and are followed by one or more fully connected layers.

Each of the functions, including kernels, in a machine learning model may be associated with different coefficients that are adjustable during training. In addition, some of the nodes in a neural network each may also be associated with an activation function that decides the weight of the output of the node in a forward propagation. Common activation functions may include step functions, linear functions, sigmoid functions, hyperbolic tangent functions (tan h), and rectified linear unit functions (ReLU). After a batch of data of training samples passes through a neural network in the forward propagation, the results may be compared to the training labels of the training samples to compute the network's loss function, which represents the performance of the network. In turn, the neural network performs backpropagation by using coordinate descent such as stochastic coordinate descent (SGD) to adjust the coefficients in various functions to improve the value of the loss function.

In training, device 100 may use neural processor circuit 218 to perform all or some of the operations in the forward propagation and backpropagation. Multiple rounds of forward propagation and backpropagation may be performed by neural processor circuit 218, solely or in coordination with other processors such as CPU 208, GPU 220, and ISP 206. Training may be completed when the loss function no longer improves (e.g., the machine learning model has converged) or after a predetermined number of rounds for a particular set of training samples. As device 100 is used, device 100 may continue to collect additional training samples for the neural network.

For prediction or inference, device 100 may receive one or more input samples. Neural processor circuit 218 may take the input samples to perform forward propagation to determine one or more results. The input samples may be images, speeches, text files, sensor data, or other data.

Data and functions (e.g., input data, kernels, functions, layers outputs, gradient data) in machine learning may be saved and represented by one or more tensors. Common operations related to training and runtime of a machine learning model may include tensor product, tensor transpose, tensor elementwise operation, convolution, application of an activation function, automatic differentiation to determine gradient, statistics and aggregation of values in tensors (e.g., average, variance, standard deviation), tensor rank and size manipulation, etc.

While the training and runtime of a neural network is discussed as an example, the neural processor circuit 218 may also be used for the operations of other types of machine learning models, such as a kernel SVM.

Figure 3:
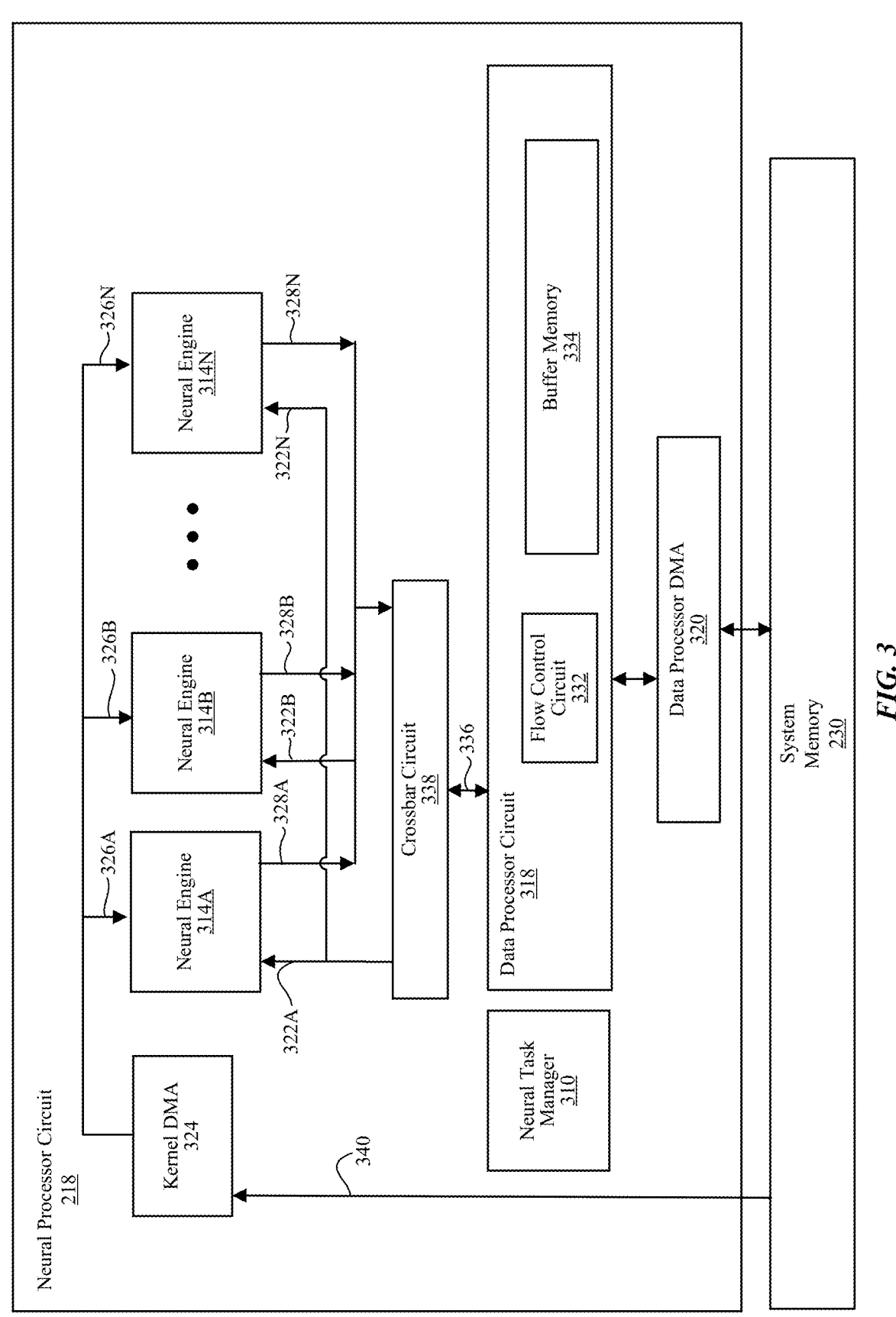
FIG. 3 is a block diagram illustrating a neural processor circuit, according to one embodiment.

Referring to FIG. 3, an example neural processor circuit 218 may include, among other components, a neural task manager 310, neural engines 314A through 314N (hereinafter collectively referred as "neural engines 314" and individually also referred to as "neural engine 314"), a kernel direct memory access (DMA) 324, a data processor circuit 318, a crossbar circuit 338 and a data processor DMA 320. Neural processor circuit 218 may include fewer or additional components not illustrated in FIG. 3.

Each of neural engines 314 performs computing operations for machine learning in parallel. Depending on the load of operation, the entire set of neural engines 314 may be operating or only a subset of neural engines 314 may be operating while the remaining neural engines 314 are placed in a power-saving mode to conserve power. Each of neural engines 314 includes components for storing one or more kernels, for performing multiply-accumulate operations, and for post-processing to generate an output data 328, as described below in detail with reference to FIG. 4. Neural engines 314 may specialize in performing computation heavy operations such as convolution operations and tensor product operations. Convolution operations may include different kinds of convolutions, such as cross-channel convolutions (a convolution that accumulates values from different channels), channel-wise convolutions, and transposed convolutions.

Neural engines 314 may focus on complex computation whose speed may primarily depend on the computation speed within each neural engine 314. For example, neural engines 314 are efficient at performing operations across multiple channels that may involve heavy accumulation of data. In one embodiment, input data may be a tensor whose rank is larger than three (e.g., having three or more dimensions). A set of dimensions (two or more) in the tensor may be referred to as a plane while another dimension may be referred to as a channel. Neural engines 314 may convolve data of a plane in the tensor with a kernel and accumulate results of the convolution of different planes across different channels.

Neural task manager 310 manages the overall operation of neural processor circuit 218. Neural task manager 310 may receive a task list from a compiler executed by CPU 208, store tasks in its task queues, choose a task to perform, and send task commands to other components of neural processor circuit 218 for performing the chosen task. Data may be associated with a task command that indicates the types of operations to be performed on the data. Data of neural processor circuit 218 includes input data that is transmitted from another source such as system memory 230, and data generated by neural processor circuit 218 in a previous operating cycle. Each dataset may be associated with a task command that specifies the type of operations to be performed on the data. Neural task manager 310 may also perform switching of tasks on detection of events such as receiving instructions from CPU 208. In one or more embodiments, neural task manager 310 sends rasterizer information to the components of neural processor circuit 218 to enable each of the components to track, retrieve or process appropriate segments of the input data and kernel data. For example, neural task manager 310 may include registers that stores the information regarding the size and rank of a dataset for processing by neural processor circuit 218. Although neural task manager 310 is illustrated in FIG. 3 as part of neural processor circuit 218, neural task manager 310 may be a component outside neural processor circuit 218.

Kernel DMA 324 is a read circuit that fetches kernel data from a source (e.g., system memory 230) and sends kernel data 326A through 326N to each of neural engines 314. Kernel data represents information from which kernel elements can be extracted. In one embodiment, the kernel data may be in a compressed format which is decompressed at each of neural engines 314. Although kernel data provided to each of neural engines 314 may be the same in some instances, the kernel data provided to each of neural engines 314 is different in most instances. In one embodiment, the direct memory access nature of kernel DMA 324 may allow kernel DMA 324 to fetch and write data directly from the source without the involvement of CPU 208.

Data processor circuit 318 manages data traffic and task performance of neural processor circuit 218. Data processor circuit 318 may include a flow control circuit 332 and a buffer memory 334. Buffer memory 334 is temporary storage for storing data associated with operations of neural processor circuit 218, such as input data that is transmitted from system memory 230 (e.g., data from a machine learning model) and other data that is generated within neural processor circuit 218. The data stored in data processor circuit 318 may include different subsets that are sent to various downstream components, such as neural engines 314.

In one embodiment, buffer memory 334 is embodied as a non-transitory memory that can be accessed by neural engines 314. Buffer memory 334 may store input data 322A through 322N for feeding to corresponding neural engines 314A through 314N, as well as output data 328A through 328N from each of neural engines 314A through 314N for feeding back into one or more neural engines 314, or sending to a target circuit (e.g., system memory 230). The inputs of neural engines 314 may be any data stored in buffer memory 334. For example, in various operating cycles, the source datasets from which one of the engines fetches as inputs may be different. The input of neural engine 314 may be an output of the same neural engine 314 in previous operating cycles, outputs of different neural engines 314, or any other suitable source datasets stored in buffer memory 334. Also, a dataset in buffer memory 334 may be divided and sent to different neural engines 314 for different operations in the next operating cycle. Two datasets in buffer memory 334 may also be joined for the next operation.

Flow control circuit 332 of data processor circuit 318 may control the flow of data between buffer memory 334 and neural engines 314. The operations of data processor circuit 318 and other components of neural processor circuit 218 are coordinated so that the input data and intermediate data stored in data processor circuit 318 may be reused across multiple operations at neural engines 314, thereby reducing data transfer to and from system memory 230. Flow control circuit 332 may perform one or more of the following operations: (i) monitor the size and rank of data (e.g. data may be one or more tensors) that are being processed by neural engines 314, (ii) determine which subsets of data are transmitted to neural engines 314 based on the task commands associated with different subsets of data, and (iii) determine the manner in which data is transmitted to neural engines 314 (e.g., data processor circuit 318 may operate in a broadcast mode where the same data is fed to multiple input channels of neural engines 314 so that multiple or all neural engines 314 receive the same data or in a unicast mode where different neural engines 314 receives different data).

The data of neural processor circuit 218 stored in buffer memory 334 may be part of, among others, image data, histogram of oriented gradients (HOG) data, audio data, metadata, output data 328 of a previous operating cycle of neural engine 314, and other processed data received from other components of SOC component 204.

Data processor DMA 320 includes a read circuit that receives a segment of the input data from a source (e.g., system memory 230) for storing in buffer memory 334, and a write circuit that forwards data from buffer memory 334 to a target component (e.g., system memory 230). In one embodiment, the direct memory access nature of data processor DMA 320 may allow data processor DMA 320 to fetch and write data directly from a source (e.g., system memory 230) without the involvement of CPU 208. Buffer memory 334 may be a direct memory access buffer that stores data of a machine learning model of device 100 without involvement of CPU 208.

Crossbar circuit 338 fetches source data 336 from data processor circuit 318 and re-aligns (or bypasses) source data 336 to generate appropriate input data 322 for at least one neural engine 314. Crossbar circuit 338 may include multiple crossbar units connected in series, each crossbar unit having a set of switches for re-aligning or bypassing source data 336 fetched from data processor circuit 318. During each operating cycle, crossbar circuit 338 fetches appropriate source data 336 from buffer memory 334, and then re-aligns or bypasses fetched source data 336 to generate an appropriate segment of input data 322 for at least one neural engine. During each operating cycle, crossbar circuit 338 may re-align source data 336 by reordering at least a portion of sets of source data 336 by a defined number of bytes, and each set of source data 336 may include the same number of bytes. Crossbar circuit 338 may also receive output data 328 from at least one neural engine circuit 314 and write output data 328 into data processor circuit 318. In one or more embodiments, crossbar circuit 338 re-aligns output data 328 prior to writing output data 328 into data processor circuit 318. In some embodiments, operation of crossbar circuit 338 is controlled by flow control circuit 332. In some other embodiments, operation of crossbar circuit 338 is controlled by some other component of neural processor circuit 218, e.g., by neural task manager 310. More details about a structure and operation of crossbar circuit 338 are described below with reference to FIG. 4, FIG. 5 and FIGS. 6A through 6F.

Example Neural Engine Architecture

Figure 4:
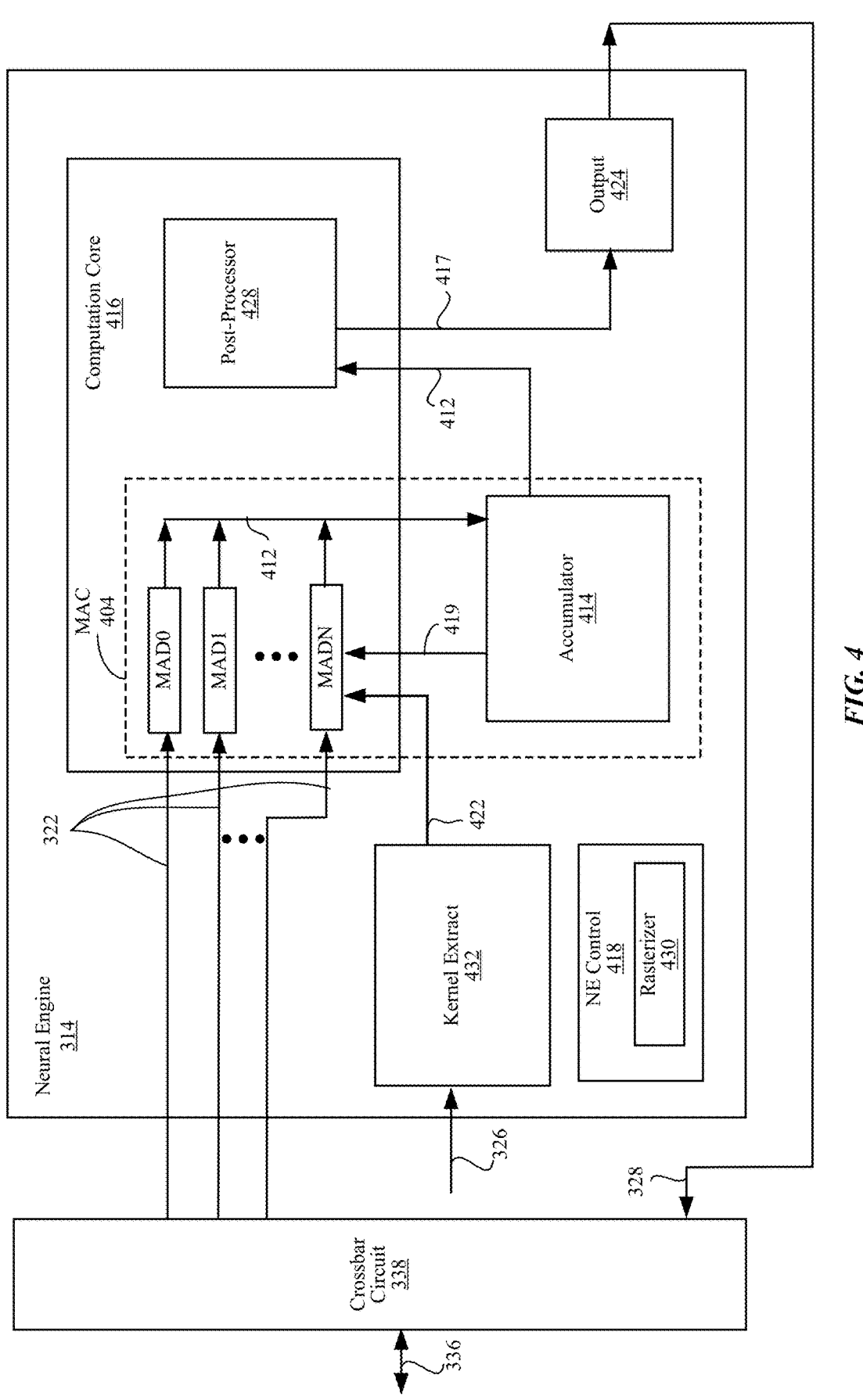
FIG. 4 is a block diagram of a neural engine in the neural processor circuit, according to one embodiment.

FIG. 4 is a block diagram of neural engine 314, according to one embodiment. Neural engine 314 performs various operations to facilitate machine learning such as convolution, tensor product, and other operations may involve heavy computation. For this purpose, neural engine 314 receives input data 322, performs multiply-accumulate operations (e.g., convolution operations) on input data 322 based on stored kernel data, performs further post-processing operations on the result of the multiply-accumulate operations, and generates output data 328. Input data 322 and/or output data 328 of neural engine 314 may be of a single channel or span across multiple channels.

Neural engine 314 may include, among other components, computation core 416, neural engine (NE) control 418, kernel extract circuit 432, accumulator circuit 414 and output circuit 424. Neural engine 314 may include fewer components than what is illustrated in FIG. 4 or include further components not illustrated in FIG. 4.

Crossbar circuit 338 is directly coupled to components of neural engine 314. Crossbar circuit 338 sends an appropriate segment data for a current task or process loop to computation core 416 for processing. Crossbar circuit 338 may re-align or bypass data 336 fetched from buffer memory 334 in order to send an appropriate segment of data as input data 322 to computation core 416. As crossbar circuit 338 sends appropriate segments of input data 322 to computation core 416 via re-aligning or bypassing during each operating cycle, neural engine 314 can perform multiply-accumulate for different segments of input data based on a fewer number of read operations. Furthermore, crossbar circuit 338 may receive output data 328 of neural engine 314, and write back output data 328 as data 336 into data processor circuit 318. Crossbar circuit 338 may re-align output data 328 to generate data 336 for writing into data processor circuit 318.

Kernel extract circuit 432 is a circuit that receives kernel data 326 from kernel DMA 324 and extracts kernel coefficients 422. In one embodiment, kernel extract circuit 432 references a lookup table (LUT) and uses a mask to reconstruct a kernel from compressed kernel data 326 based on the LUT. The mask indicates locations in the reconstructed kernel to be padded with zero and remaining locations to be filled with numbers. Kernel coefficients 422 of the reconstructed kernel are sent to computation core 416 to populate register in multiply-add (MAD) circuits of computation core 416. In other embodiments, kernel extract circuit 432 receives kernel data in an uncompressed format and the kernel coefficients are determined without referencing a LUT or using a mask.

Computation core 416 is a programmable circuit that performs computation operations. For this purpose, computation core 416 may include MAD circuits MADO through MADN and a post-processor 428. Each of MAD circuits MADO through MADN may store an input value in the segment 408 of the input data and a corresponding kernel coefficient in kernel coefficients 422. The input value and the corresponding kernel coefficient are multiplied in each of MAD circuits to generate a processed value 412.

Accumulator circuit 414 is a memory circuit that receives and stores processed values 412 from MAD circuits. The processed values stored in accumulator circuit 414 may be sent back as feedback information 419 for further multiply and add operations at MAD circuits or sent to post-processor 428 for post-processing. Accumulator circuit 414 in combination with MAD circuits form a multiply-accumulator (MAC) 404. In one or more embodiments, accumulator circuit 414 may have subunits (or batches) where each subunit sends data to different components of neural engine 314. For example, during an operating cycle, data stored in a first subunit of accumulator circuit 414 is sent to MAC 404 while data stored in a second subunit of accumulator circuit 414 is sent to post-processor 428.

Post-processor 428 is a circuit that performs further processing of values 412 received from accumulator circuit 414. Post-processor 428 may perform operations including, but not limited to, applying linear functions (e.g., Rectified Linear Unit (ReLU)), normalized cross-correlation (NCC), merging the results of performing neural operations on 8-bit data into 16-bit data, and local response normalization (LRN). The result of such operations is output from post-processor 428 as processed values 417 to output circuit 424. In some embodiments, the processing at post-processor 428 is bypassed. For example, the data in accumulator circuit 414 may be sent directly to output circuit 424 for access by other components of neural processor circuit 218.

NE control 418 controls operations of other components of neural engine 314 based on the operation modes and parameters of neural processor circuit 218. Depending on different modes of operation (e.g., group convolution mode or non-group convolution mode) or parameters (e.g., the number of input channels and the number of output channels), neural engine 314 may operate on different input data in different sequences, return different values from accumulator circuit 414 to MAD circuits, and perform different types of post-processing operations at post-processor 428. To configure components of neural engine 314 to operate in a desired manner, NE control 418 sends task commands that may be included in information 419 to components of neural engine 314. NE control 418 may include a rasterizer 430 that tracks the current task or process loop being processed at neural engine 314.

Rasterizer 430 may perform the operations associated with dividing the input data into smaller units (segments) and regulate the processing of the smaller units through MACs 404 and accumulator circuit 414. Rasterizer 430 keeps track of sizes and ranks of segments of the input/output data (e.g., groups, input channels, output channels) and instructs the components of neural processor circuit 218 for proper handling of the segments of the input data. Other components of neural processor circuit 218 (e.g., kernel DMA 324, buffer DMA 320, buffer memory 334) may also have their corresponding rasterizers to monitor the division of input data and the parallel computation of various segments of input data in different components.

Output circuit 424 receives processed values 417 from post-processor 428 and interfaces with data processor circuit 318 via crossbar circuit 338 to store processed values 417 in data processor circuit 318. For this purpose, output circuit 424 may send out output data 328 in a sequence or a format that is different from the sequence or format in which the processed values 417 are processed in post-processor 428.

The components in neural engine 314 may be configured during a configuration period by NE control 418 and neural task manager 310. For this purpose, neural task manager 310 sends configuration information to neural engine 314 during the configuration period. The configurable parameters and modes may include, but are not limited to, mapping between input data elements and kernel elements, the number of input channels, the number of output channels, performing of output strides, and enabling/selection of post-processing operations at post-processor 428.

Example Crossbar Circuit

Figure 5:
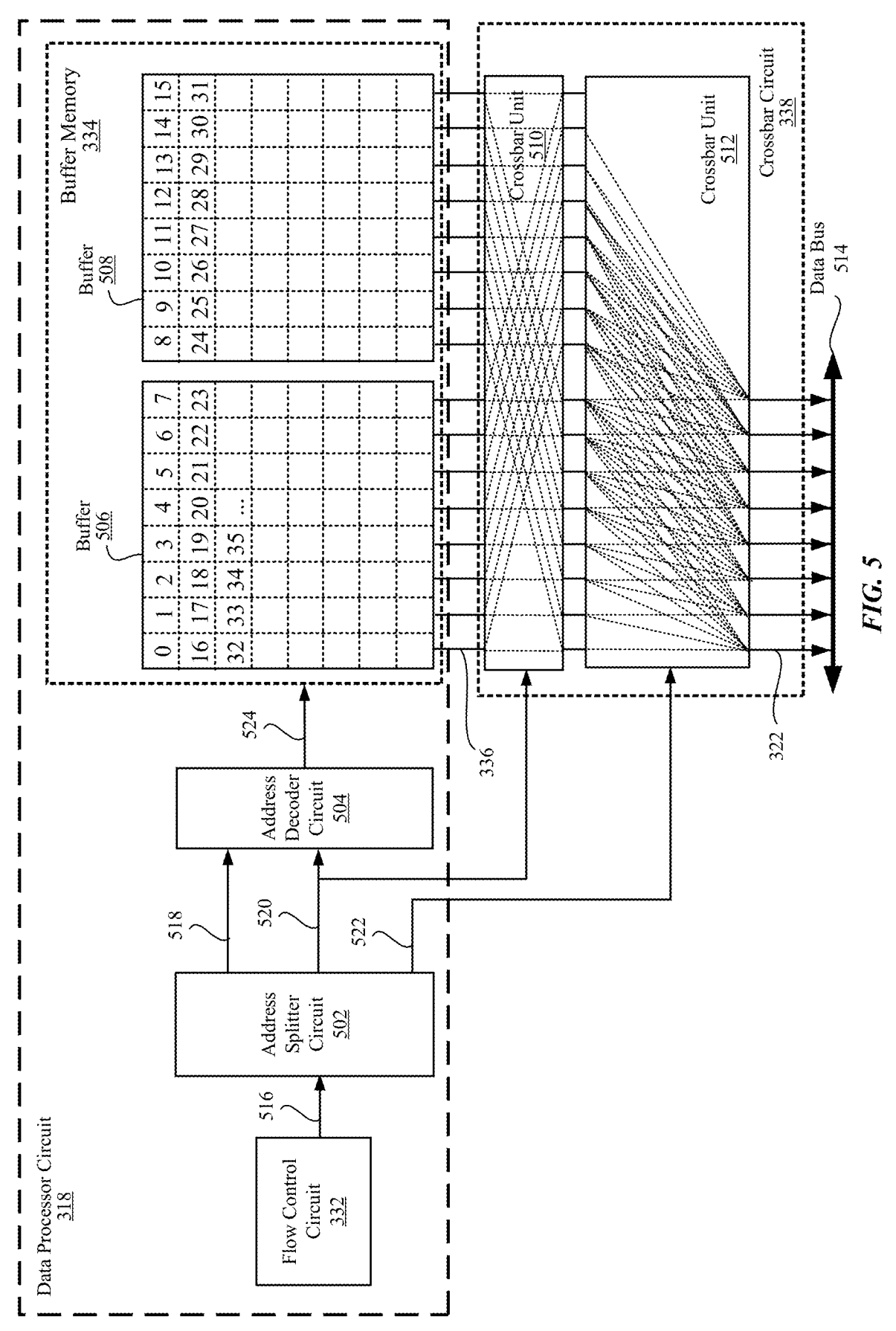
FIG. 5 is a block diagram of a crossbar circuit coupled to a data processor circuit in the neural processor circuit, according to one embodiment.

FIG. 5 is a block diagram of crossbar circuit 338 coupled to data processor circuit 318, according to one embodiment. During each operating cycle, crossbar circuit 338 receives data 336 from buffer memory 334, and re-aligns or bypasses data 336 to generate input data 322 for neural engine 314. Buffer memory 334 of data processor circuit 318 may include one or more buffers to store input data. As shown in FIG. 5, buffer memory 334 includes a pair of buffers 506 and 508. However, in some other embodiments (not shown in FIG. 5), buffer memory 334 may include a single buffer or more than two buffers. Each buffer 506, 508 may be implemented as a static random-access memory (SRAM). Each storage location in buffer memory 334 (e.g., in buffers 506, 508) may store a respective data element (e.g., pixel value of an image). Data elements are shown in FIG. 5 as their respective numbers, e.g., data element 0, data element 1, . . . , data element 35, etc. A precision of each data element may be, e.g., 8 bits (1 byte) for a total width of each buffer 506, 508 of 64 bits (8 bytes). In some other embodiments, a precision of each data element stored in buffer memory 334 (e.g., in buffers 506, 508) may be different than 8 bits, e.g., 16 bits. A depth of each buffer 506, 508 can be eight words, which means that each row of buffers 506, 508 can store eight data elements each having one word (byte). However, other depths of buffers 506, 508 are possible.

Data processor circuit 318 further includes an address splitter circuit 502 coupled to flow control circuit 332, and an address decider circuit 504 coupled to address splitter circuit 502 and buffer memory 334. During each operating cycle, flow control circuit 332 generates an address 516 for accessing corresponding data elements (e.g., pixel values) from buffer memory 334 (e.g., buffer 506 and/or buffer 508). Flow control circuit 332 passes address 516 onto address splitter circuit 502. Address splitter circuit 502 may split address 516 into multiple address components, e.g., a first address component 518, a second address component 520 and a third address component 522. First address component 518 may be a most significant portion of address 516, and third address component 522 may be a least significant portion of address 516. For example, address 516 may be a seven bit memory address, first address component 518 may correspond to three most significant bits of address 516, third address component 522 may correspond to three least significant bits of address 516, and second address component 520 may correspond to one remaining bit of address 516 (e.g., a bit in the middle of the 7-bit address 516). First address component 518 and second address component 520 are passed onto address decoder circuit 504 that decodes first and second address components 518, 520 to generate a decoded address 524 for buffer memory 334. Based on a value of decoded address 524, address decoder circuit 504 may initiate loading of corresponding data 336 from buffer memory 334 (e.g., corresponding data elements from buffer 506 and/or buffer 508). Data 336 loaded from buffer memory 334 are passed onto crossbar circuit 338.

Address splitter circuit 502 may pass second and third address components 520, 522 onto crossbar circuit 338. Second and third address components 520, 522 may configure crossbar circuit 338 to appropriately re-align (or bypass) data 336 loaded from buffer memory 334. Crossbar circuit 338 may include multiple crossbar units connected in series, e.g., crossbar units 510, 512, as shown in FIG. 5. In some other embodiments (not shown in FIG. 5), crossbar circuit 338 is composed of a single crossbar unit Each crossbar unit 510, 512 is made of data lanes (e.g., data connections) and a corresponding set of switches for re-aligning (or bypassing) data input into a respective crossbar unit 510, 512. As shown in FIG. 5, second address component 520 may configure a first set of switches in crossbar unit 510 to appropriately re-align (or bypass) data 336 input onto crossbar unit 512. As further shown in FIG. 5, third address component 522 may configure a second set of switches in crossbar unit 512 to appropriately re-align (or bypass) data output by crossbar unit 510 to generate input data 322 for at least one neural engine 314. Each crossbar unit 510, 512 may re-align its respective input data by reordering at least a portion of sets of the input data by a defined number of bytes, and each set of the input data may comprise a same number of bytes.

In some embodiments, a data bus 514 is coupled to outputs of crossbar circuit 338 and functions as an interface between the outputs of crossbar circuit 338 and inputs of at least one neural engine 314. During each operating cycle, crossbar circuit 338 provides the re-aligned or bypassed input data 322 onto data bus 514. At least one neural engine 314 may receive the re-aligned or bypassed input data 322 from data bus 514, which represents an appropriate segment of input data 322 passed onto computation core 416 for a portion of convolution operation performed during a corresponding operating cycle of at least one neural engine 314. During each operating cycle, crossbar circuit 338 may re-align (or bypass) data 336 received from buffer memory 334 such that any re-aligned (or bypassed) version of data 336 is output onto data bus 514 as an appropriate segment of input data 322 for usage by at least one neural engine 314.

Example Operation of Crossbar Circuit

FIGS. 6A through 6F illustrate accessing and re-aligning different portions of data 336 loaded from data processor circuit 318 by using crossbar circuit 338 during multiple operating cycles, according to one embodiment. It should be noted that FIGS. 6A through 6F may not correspond to consecutive operating cycles, but they only illustrate different examples of reading different portions of data elements from different portions of buffer memory 334 (e.g., buffer 506 and/or buffer 508).

Figure 6A:
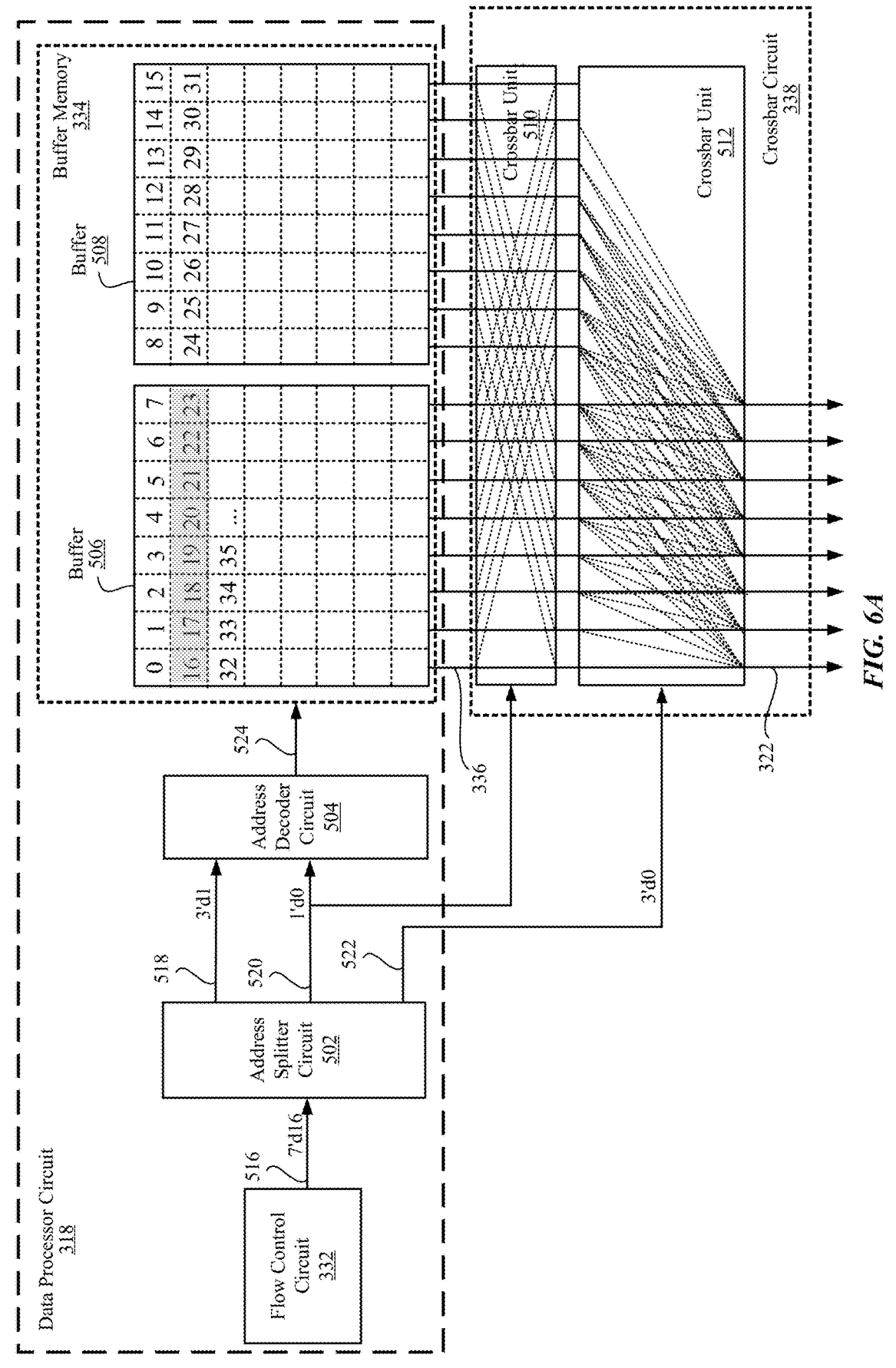
FIGS. 6A through 6F illustrate accessing and re-aligning different portions of input data from the data processor circuit using the crossbar circuit during multiple operating cycles, according to one embodiment.

As shown in FIG. 6A, during a first operating cycle, flow control circuit 332 generates address 516 of 7'd16 (e.g., decimal 16 represented by 7 bits) to initiate accessing a defined number of data elements (e.g., eight data elements for eight neural engines 314) starting from an address in buffer memory 334 that stores data element 16. Address splitter circuit 502 splits address 516 into first address component 518 of 3'd1, second address component 520 of 1'd0 and third address component 522 of 3'd0. Address decoder circuit 524 uses first and second address components 518, 520 (e.g., 3'd1 and 1'd0) to generate decoded address 524 that initiates reading of eight data elements from buffer 506 starting from data element 16 (e.g., data element 16, data element 17, . . . , data element 23). Switches in crossbar unit 510 are configured by second address component 520 (e.g., 1'd0) such that crossbar unit 510 only propagates (e.g., bypasses) data 336 onto crossbar unit 512 without any re-alignment. Switches in crossbar unit 512 are configured by third address component 522 (e.g., 3'd0) such that crossbar unit 512 also propagates (e.g., bypasses) data to generate appropriate segments of output data 322 for neural engines 314.

Figure 6B:
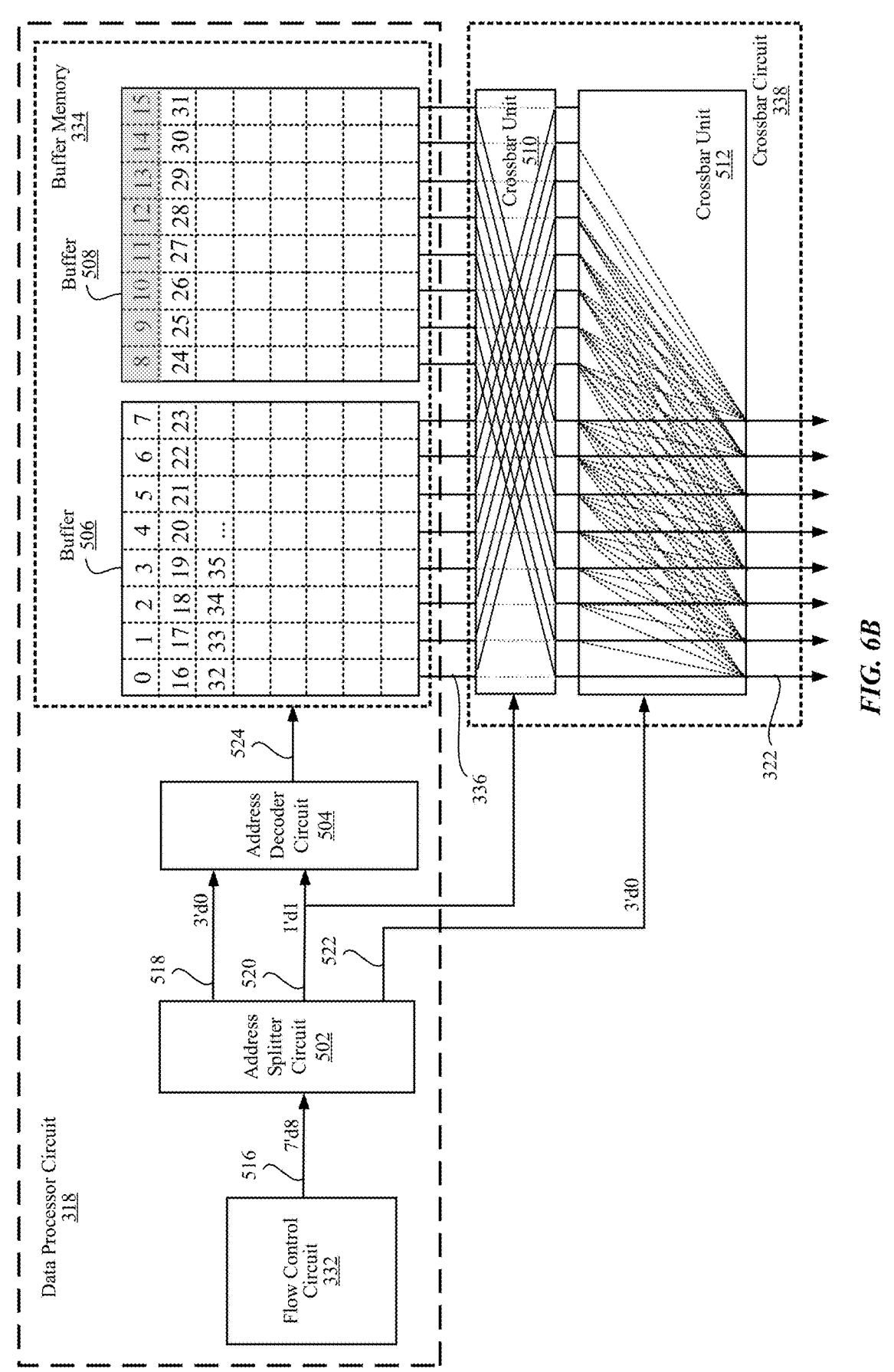

As shown in FIG. 6B, during a second operating cycle, flow control circuit 332 generates address 516 of 7'd8 (e.g., decimal 8 represented by 7 bits) to initiate accessing a defined number of data elements (e.g., eight data elements for eight neural engines 314) starting from an address in buffer memory 334 that stores data element 8. Address splitter circuit 502 splits address 516 into first address component 518 of 3'd0, second address component 520 equals to 1'd1 and third address component 522 of 3'd0. Address decoder circuit 524 uses first and second address components 518, 520 (e.g., 3'd0 and 1'd1) to generate decoded address 524 that initiates reading of eight data elements from buffer 508 starting from data element 8 (e.g., data element 8, data element 9, . . . , data element 15). Switches in crossbar unit 510 are configured by second address component 520 (e.g., 1'd1) such that crossbar unit 510 appropriately re-aligns (reorders) data 336 such that data elements from buffer 508 are passed onto crossbar unit 512. In comparison with the function of crossbar unit 510 in FIG. 6A that only propagates data elements loaded from buffer 506 due to second address component 520 being equal to "0" (or 1'd0), crossbar unit 510 in FIG. 6B re-aligns data 336 due to second address component 520 being equal to "1" (or 1'd1). Switches in crossbar unit 512 are configured by third address component 522 (e.g., 3'd0) such that crossbar unit 512 only propagates (e.g., bypasses) data to generate appropriate segments of output data 322 for neural engines 314.

Figure 6C:
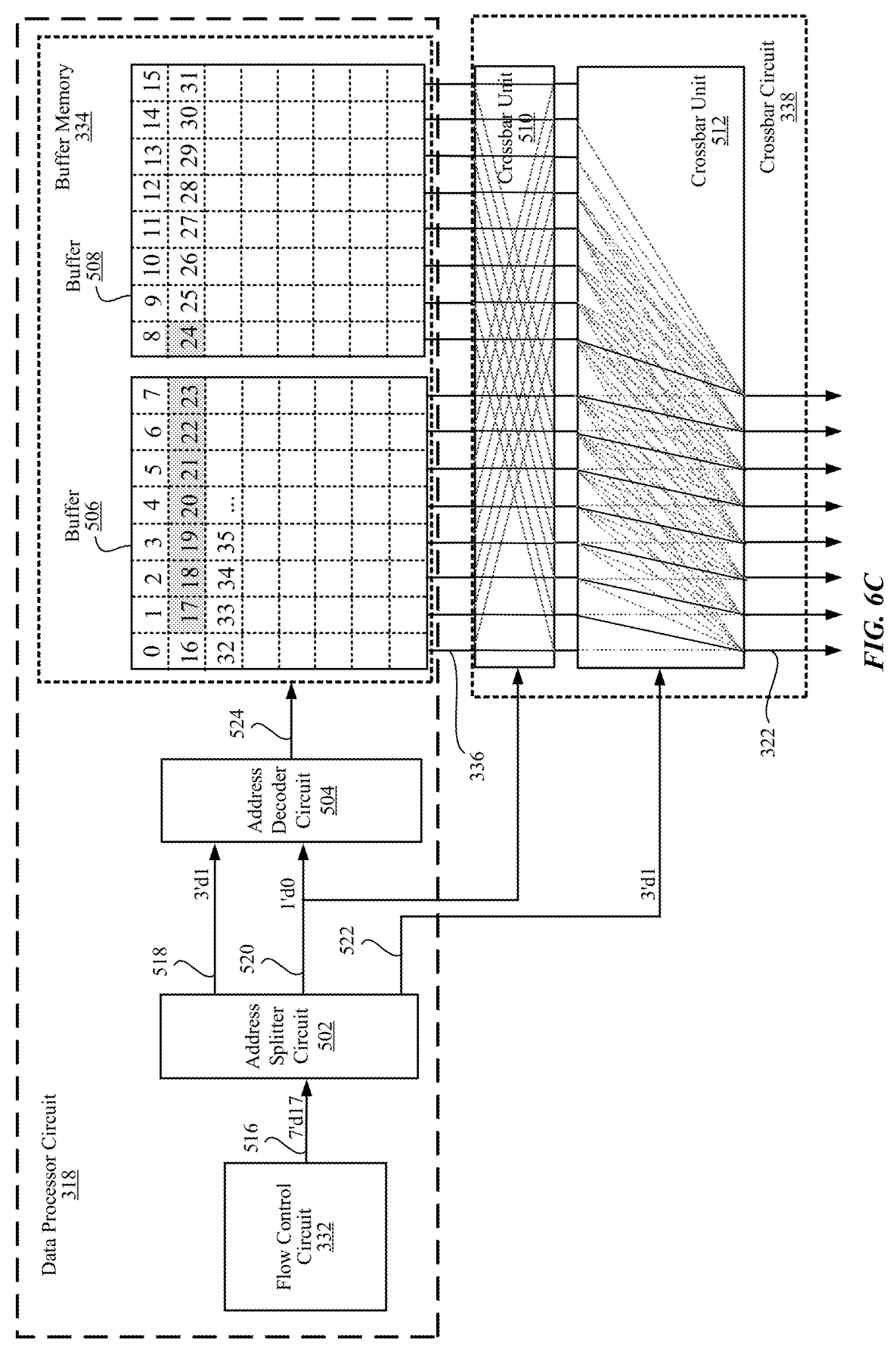

As shown in FIG. 6C, during a third operating cycle, flow control circuit 332 generates address 516 of 7'd17 (e.g., decimal 17 represented by 7 bits) to initiate accessing a defined number of data elements (e.g., eight data elements for eight neural engines 314) starting from an address in buffer memory 334 that stores data element 17. Address splitter circuit 502 splits address 516 into first address component 518 of 3'd1, second address component 520 of 1'd0 and third address component 522 of 3'd1. Address decoder circuit 524 uses first and second address components 518, 520 (e.g., 3'd1 and 1'd0) to generate decoded address 524 that initiates reading of eight data elements from buffers 506, 508 starting from data element 17 (e.g., data element 17, data element 18, . . . , data element 23 from buffer 506, followed by data element 24 from buffer 508). Switches in crossbar unit 510 are configured by second address component 520 (e.g., 1'd0) such that crossbar unit 510 only propagates (bypasses) data 336 from buffers 506, 508 onto crossbar unit 512. Switches in crossbar unit 512 are configured by third address component 522 (e.g., 3'd1) such that crossbar unit 512 re-aligns data from crossbar unit 510 such that, e.g., seven data elements from buffer 506 and one data element from buffer 508 are output to generate appropriate segments of output data 322 for neural engines 314. In comparison with the function of crossbar unit 512 in FIG. 6A and FIG. 6B that only propagates data elements due to third address component 522 being equal to "0" (or 3'd0), crossbar unit 512 in FIG. 6C performs data re-alignment due to third address component 520 being equal to "1" (or 3'd1).

Figure 6D:
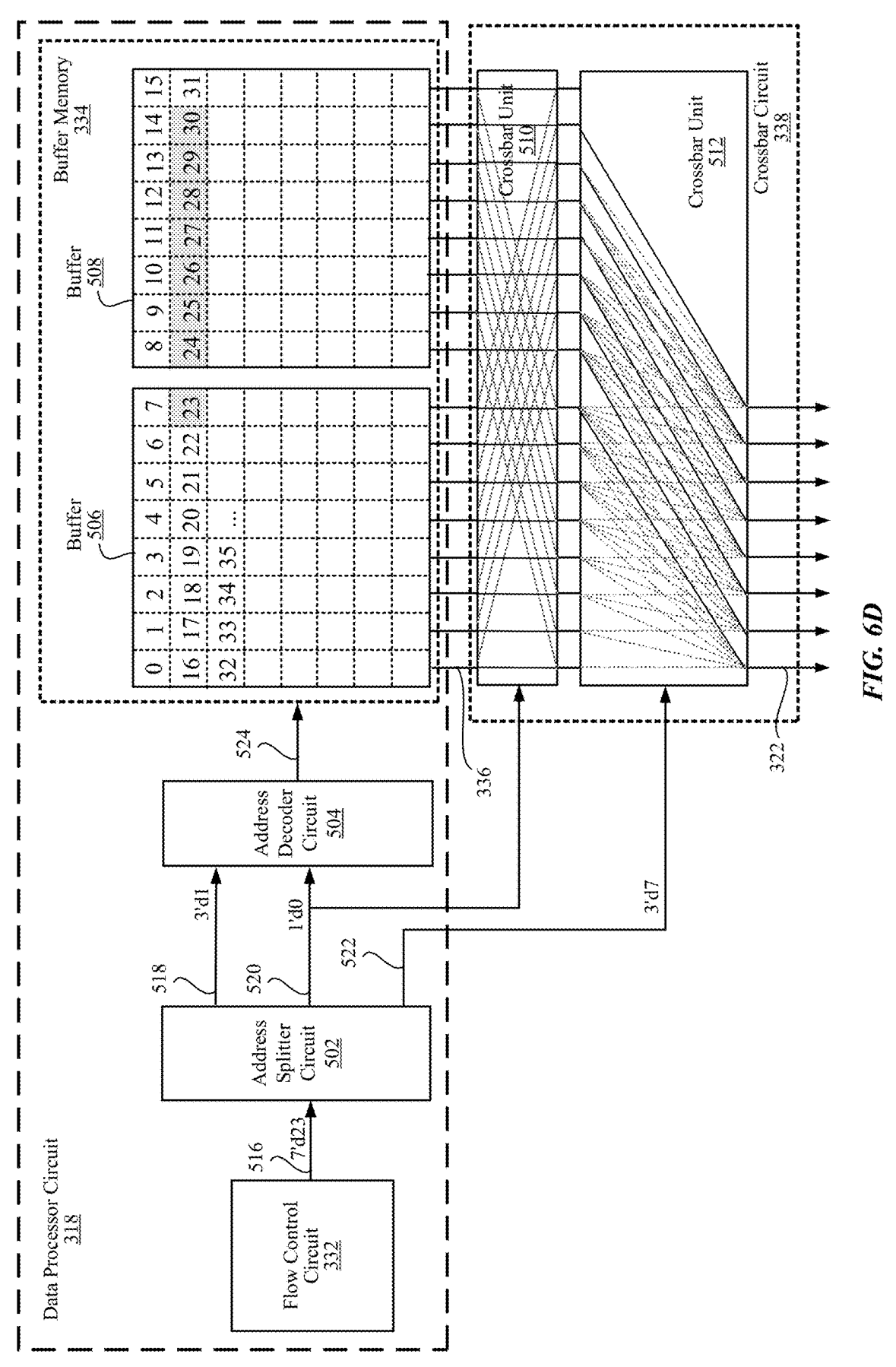

As shown in FIG. 6D, during a fourth operating cycle, flow control circuit 332 generates address 516 of 7'd23 (e.g., decimal 23 represented by 7 bits) to initiate accessing a defined number of data elements (e.g., eight data elements for eight neural engines 314) starting from an address in buffer memory 334 that stores data element 23. Address splitter circuit 502 splits address 516 into first address component 518 of 3'd1, second address component 520 of 1'd0 and third address component 522 of 3'd7. Address decoder circuit 524 uses first and second address components 518, 520 (e.g., 3'd1 and 1'd0) to generate decoded address 524 that initiates reading of eight data elements from buffers 506, 508 starting from data element 23 (e.g., data element 23 from buffer 506, followed by data element 24, data element 25, . . . , data element 30 from buffer 508). Switches in crossbar unit 510 is configured by second address component 520 (e.g., 1'd0) such that crossbar unit 510 only propagates (bypasses) data 336 from buffers 506, 508 onto crossbar unit 512. Switches in crossbar unit 512 are configured by third address component 522 (e.g., 3'd7) to appropriately re-align data from crossbar unit 510 such that, e.g., one data element from buffer 506 and seven data elements from buffer 508 are output by crossbar unit 512 (and crossbar circuit 338) to generate appropriate segments of output data 322 for neural engines 314.

Figure 6E:
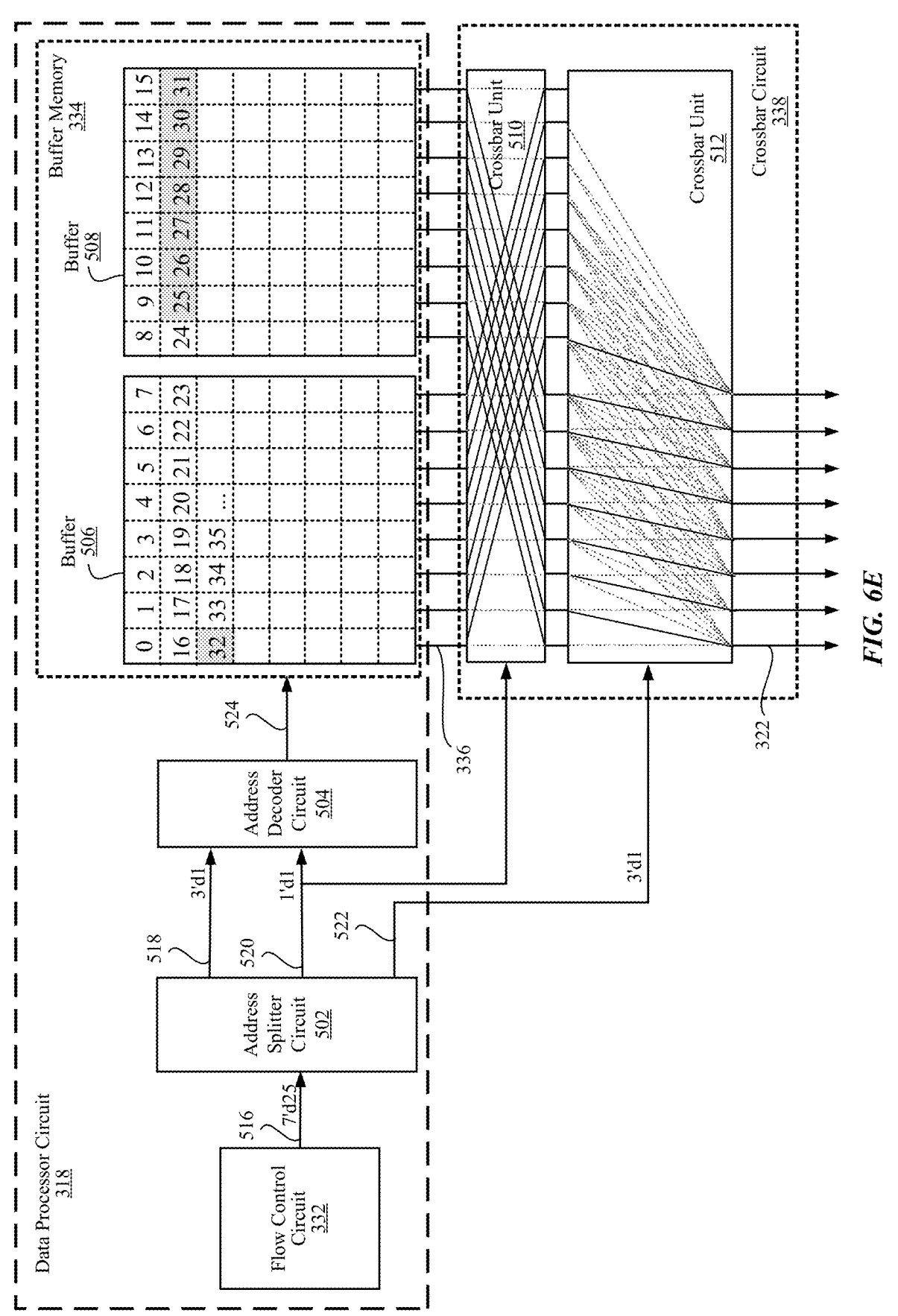

As shown in FIG. 6E, during a fifth operating cycle, flow control circuit 332 generates address 516 of 7'd25 (e.g., decimal 25 represented by 7 bits) to initiate accessing a defined number of data elements (e.g., eight data elements for eight neural engines 314) starting from an address in buffer memory 334 that stores data element 25. Address splitter circuit 502 splits address 516 into first address component 518 of 3'd1, second address component 520 of 1'd1 and third address component 522 of 3'd1. Address decoder circuit 524 uses first and second address components 518, 520 (e.g., 3'd1 and 1'd1) to generate decoded address 524 that initiates reading of eight data elements from buffers 506, 508 starting from data element 25 (e.g., data element 25, data element 26, . . . , data element 31 from buffer 508, followed by data element 32 from buffer 506). Switches in crossbar unit 510 are configured by second address component 520 (e.g., 1'd1) to re-align data 336 from buffers 506, 508 onto crossbar unit 512. Switches in crossbar unit 512 are configured by third address component 522 (e.g., 3'd1) to appropriately re-align data from crossbar unit 510 such that seven data elements from buffer 508 and one data element from buffer 506 are output by crossbar unit 512 (and crossbar circuit 338) to generate appropriate segments of output data 322 for neural engines 314.

Figure 6F:
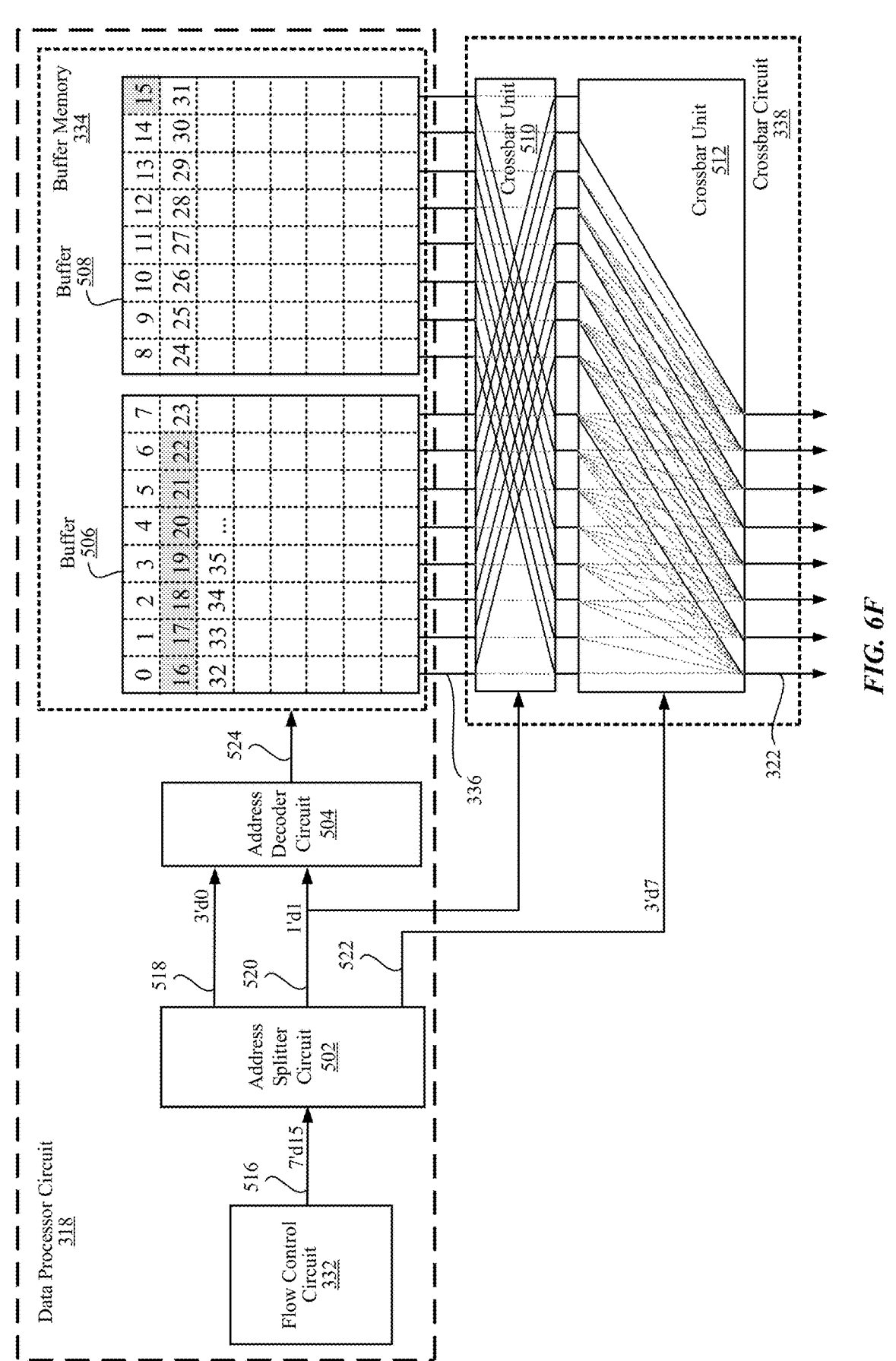

As shown in FIG. 6F, during a sixth operating cycle, flow control circuit 332 generates address 516 of 7'd15 (e.g., decimal 15 represented by 7 bits) to initiate accessing a defined number of data elements (e.g., eight data elements for eight neural engines 314) starting from an address in buffer memory 334 that stores data element 15. Address splitter circuit 502 splits address 516 into first address component 518 of 3'd0, second address component 520 of 1'd1 and third address component 522 of 3'd7. Address decoder circuit 524 uses first and second address components 518, 520 (e.g., 3'd0 and 1'd1) to generate decoded address 524 that initiates reading of eight data elements from buffers 506, 508 starting from data element 25 (e.g., data element 15 from buffer 508, followed by data element 26, data element 17, . . . , data element 22 from buffer 506). Switches in crossbar unit 510 are configured by second address component 520 (e.g., 1'd1) to re-align data 336 from buffers 506, 508 onto crossbar unit 512. Switches in crossbar unit 512 are configured by third address component 522 (e.g., 3'd7) to re-align data from crossbar unit 510 such that, e.g., one data element from buffer 508 and seven data elements from buffer 506 are output by crossbar unit 512 (and crossbar circuit 338) to generate appropriate segments of output data 322 for neural engines 314.

Example Processes at Neural Engine Architecture

FIG. 7 is a flowchart illustrating a method of re-aligning or bypassing a portion of input data (e.g., input data 322) in a neural processor circuit (e.g., neural processor circuit 218) using a crossbar circuit (e.g., crossbar circuit 338), according to one embodiment. The neural processor circuit receives 702 a portion of input data at the crossbar circuit during each operating cycle of the neural processor circuit.

The neural processor circuit re-aligns or bypasses 704 the portion of input data by the crossbar circuit during each operating cycle. The neural processor circuit receives 706, at a neural engine circuit (e.g., neural engine 314) coupled to the crossbar circuit, at least a portion of the re-aligned or bypassed portion of input data. The neural processor circuit performs 708, by the neural engine circuit, a convolution operation on the received portion of re-aligned or bypassed portion of input data to generate output data (e.g., output data 328).

Embodiments of the process as described above with reference to FIG. 7 are merely illustrative. Moreover, sequence of the process may be modified or omitted.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. A neural processor circuit, comprising:
a data processor circuit, the data processor circuit comprising:
   a buffer memory configured to store input data comprising a plurality of data elements, wherein a data element occupies a location of the buffer memory that is addressed by a data address; and
   an address decoder circuit coupled to the buffer memory and configured to decode one or more address components of an address for the buffer memory including a most significant address component to generate a decoded address for the buffer memory to access a portion of input data comprising multiple data elements of the plurality of data elements;
a crossbar circuit coupled to the data processor circuit and configured, during each operating cycle, to receive one or more address components of the address including a least significant address component, and further receive the portion of input data from the buffer memory based on the decoded address, and re-align the multiple data elements of the portion of input data accessed by the decoded address or bypass the portion of input data, wherein the crossbar circuit is directly coupled to the data processor circuit and a neural engine circuit, bypassing cache or buffer components, to reduce power consumption by the neural engine circuit; and the neural engine circuit coupled to the crossbar circuit, the neural engine circuit configured to receive at least a portion of the re-aligned or bypassed portion of the input data, and perform a convolution operation on the received portion of the re-aligned or bypassed portion of input data to generate output data.

2. The neural processor circuit of claim 1, wherein the crossbar circuit is further configured to:

re-align the portion of input data by reordering at least a portion of a plurality of sets of the portion of input data by a defined number of bytes.

3. The neural processor circuit of claim 2, wherein each set of the portion of input data comprises a same number of bytes of the portion of input data.

4. The neural processor circuit of claim 1, wherein:

the one or more address components including the most significant address component provided to the address decoder circuit to generate the decoded address and the one or more address components including the least significant address component provided to the crossbar circuit share at least a common address component; and the address decoder circuit is configured, during each operating cycle, to initiate loading of the portion of input data from the buffer memory to the crossbar circuit in accordance with the decoded address.

5. The neural processor circuit of claim 4, wherein the data processor circuit further comprises an address splitter circuit coupled to the address decoder circuit and the crossbar circuit, the address splitter circuit being configured, during each operating cycle, to:

split the address into a plurality of address components; and configure the crossbar circuit to re-align or bypass the portion of input data based on the one or more address components including the least significant address component from the address splitter circuit.

6. The neural processor circuit of claim 1, wherein the crossbar circuit comprises a pair of crossbar units connected in series, each crossbar unit comprising a plurality of switches configured to re-align or bypass the portion of input data.

7. The neural processor circuit of claim 1, wherein the crossbar circuit is further configured to:

receive the output data from the neural engine circuit; and write the received output data into the data processor circuit.

8. The neural processor circuit of claim 7, wherein the crossbar circuit is further configured to:

re-align the received output data prior to writing the received output data into the data processor circuit.

9. The neural processor circuit of claim 1, further comprising a data bus coupled to outputs of the crossbar circuit and inputs of the neural engine circuit, wherein:

the crossbar circuit is further configured to provide, during each operating cycle, the re-aligned or bypassed portion of input data onto the data bus; and

the neural engine circuit is further configured to receive the portion of the re-aligned or bypassed portion of input data from the data bus.

10. The neural processor circuit of claim 1, further comprising a data bus coupled to outputs of the crossbar circuit, wherein the crossbar circuit is further configured, during each operating cycle, to:

receive the portion of input data from the data processor circuit; and re-align or bypass the received portion of input data such that any re-aligned or bypassed version of the portion of input data is output onto the data bus.

11. A method of operating a neural processor circuit, comprising:

storing, in a buffer memory of a data processor circuit, input data comprising a plurality of data elements, wherein a data element occupies a location of the buffer memory that is addressed by a data address;

decoding, by an address decoder circuit of the data processor circuit, one or more address components of an address for the buffer memory including a most significant address component to generate a decoded address for the buffer memory to access a portion of input data comprising multiple data elements of the plurality of data elements;

receiving, by a crossbar circuit, one or more address components including a least significant address component generated from the address for the buffer memory;

receiving, by the crossbar circuit, the portion of input data from the buffer memory based on the decoded address during each operating cycle;

re-aligning the multiple data elements of the portion of input data accessed by the decoded address or bypassing the portion of input data by the crossbar circuit during each operating cycle;

receiving, at a neural engine circuit coupled to the crossbar circuit, at least a portion of the re-aligned or bypassed portion of input data, wherein the crossbar circuit is directly coupled to the data processor circuit and the neural engine circuit, bypassing cache or buffer components, to reduce power consumption by the neural engine circuit; and performing, by the neural engine circuit, a convolution operation on the received portion of re-aligned or bypassed portion of input data to generate output data.

12. The method of claim 11, further comprising:

re-aligning, by the crossbar circuit, the portion of input data by reordering at least a portion of a plurality of sets of the portion of input data by a defined number of bytes.

13. The method of claim 11, further comprising:

loading, during each operating cycle, the portion of input data from the buffer memory to the crossbar circuit in accordance with the decoded address, wherein the one or more address components including the most significant address component provided to the address decoder circuit to generate the decoded address and the one or more address components including the least significant address component provided to the crossbar circuit share at least a common address component.

14. The method of claim 13, further comprising:

splitting, during each operating cycle by an address splitter circuit coupled to the address decoder circuit and the crossbar circuit, the address into a plurality of address components;

configuring, during each operating cycle, the crossbar circuit to re-align or bypass the portion of input data based on the one or more address components including the least significant address component from the address splitter circuit.

15. The method of claim 11, further comprising:
receiving the output data from the neural engine circuit at the crossbar circuit; and
writing, via the crossbar circuit, the received output data into the data processor circuit coupled to the crossbar circuit.

16. The method of claim 15, further comprising:
re-aligning, by the crossbar circuit, the received output data prior to writing the received output data into the data processor circuit.

17. The method of claim 11, further comprising:
providing, by the crossbar circuit during each operating cycle, the re-aligned or bypassed portion of input data onto a data bus coupled to outputs of the crossbar circuit and inputs of the neural engine circuit; and
receiving, at the neural engine circuit, the portion of the re-aligned or bypassed portion of input data from the data bus.

18. The method of claim 11, further comprising:
re-aligning or bypassing, during each operating cycle, the received portion of input data such that any re-aligned or bypassed version of the portion of input data is output onto a data bus coupled to outputs of the crossbar circuit.

19. An electronic device, comprising:
a system memory storing input data; and
a neural processor circuit coupled to the system memory, the neural processor circuit including:
    a data processor circuit, the data processor circuit comprising:
        a buffer memory configured to store input data comprising a plurality of data elements, wherein a data element occupies a location of the buffer memory that is addressed by a data address; and
        an address decoder circuit coupled to the buffer memory and configured to decode one or more address components of an address for the buffer memory including a most significant address component to generate a decoded address for the buffer memory to access a portion of input data comprising multiple data elements of the plurality of data elements;
a crossbar circuit coupled to the data processor circuit and configured, during each operating cycle, to receive one or more address components of the address including a least significant address component, and further receive the portion of the input data from the buffer memory based on the decoded address, and re-align the multiple data elements of the portion of input data accessed by the decoded address or bypass the portion of input data, and
a neural engine circuit coupled to the crossbar circuit, wherein the crossbar circuit is directly coupled to the data processor circuit and the neural engine circuit, bypassing cache or buffer components, to reduce power consumption by the neural engine circuit, the neural engine circuit configured to:
    receive at least a portion of the re-aligned or bypassed portion of input data, and
    perform a convolution operation on the received portion of re-aligned or bypassed portion of input data to generate output data.

20. The electronic device of claim 19, wherein the data processor circuit includes an address splitter circuit coupled to the address decoder circuit and the crossbar circuit, wherein:
    the address decoder circuit is configured, during each operating cycle, to:
        initiate loading of the portion of input data from the buffer memory to the crossbar circuit in accordance with the decoded address;
    the address splitter circuit is configured, during each operating cycle, to:
        split the address into a plurality of address components, and
        configure the crossbar circuit to re-align or bypass the portion of input data based on the one or more address components including the least significant address component from the address splitter circuit, and
    the crossbar circuit is further configured to re-align the portion of input data by reordering at least a portion of a plurality of sets of the portion of input data by a defined number of bytes.

* * * * *